United States Patent [19]

Beery et al.

[11] 4,136,364
[45] Jan. 23, 1979

[54] MULTI-STATE WOW AND FLUTTER REDUCTION SYSTEM AND METHOD

[75] Inventors: John C. Beery, Locust Grove; Harvey L. Huston, Fairfax, both of Va.

[73] Assignee: Signature Systems, Inc., Springfield Va.

[21] Appl. No.: 812,382

[22] Filed: Jul. 1, 1977

[51] Int. Cl.² ............................................. G11B 5/02
[52] U.S. Cl. ................................................ 360/28
[58] Field of Search .................................. 360/27, 28

[56] References Cited

U.S. PATENT DOCUMENTS

| 3,181,133 | 4/1965 | Seirner | 360/28 |
|---|---|---|---|
| 3,204,047 | 8/1965 | Trost et al. | 360/27 |
| 3,433,903 | 3/1969 | Murray et al. | 360/28 |
| 3,488,452 | 1/1970 | Gunning et al. | 360/28 |
| 3,803,630 | 4/1974 | Belcher et al. | 360/27 |
| 3,839,729 | 10/1974 | Gross | 360/27 |
| 3,872,504 | 3/1975 | Belcher | 360/27 |

Primary Examiner—Vincent P. Canney
Attorney, Agent, or Firm—Wigman & Cohen

[57] ABSTRACT

An improved method and apparatus for reducing wow and flutter associated with recording devices are disclosed. Two input signals containing useful information and a constant reference signal are recorded and reproduced by a three channel recording and reproducing system. The reproduced signals contain, in addition to the recorded signals, frequency deviations caused by wow and flutter of the recording and reproducing system. Reproduced signals are converted to frequency-dependent voltages and the constant reference signal is subtracted from the reproduced reference voltage to provide a reference error voltage. The reference error voltge is transmitted to a multi-state control circuit in which the reference error voltage cancels the error voltage components of the two reproduced information frequency-dependent voltages leaving only the frequency-dependent information input signal voltages which are then transformed into frequency signals substantially equal to the recorded information signals.

9 Claims, 5 Drawing Figures

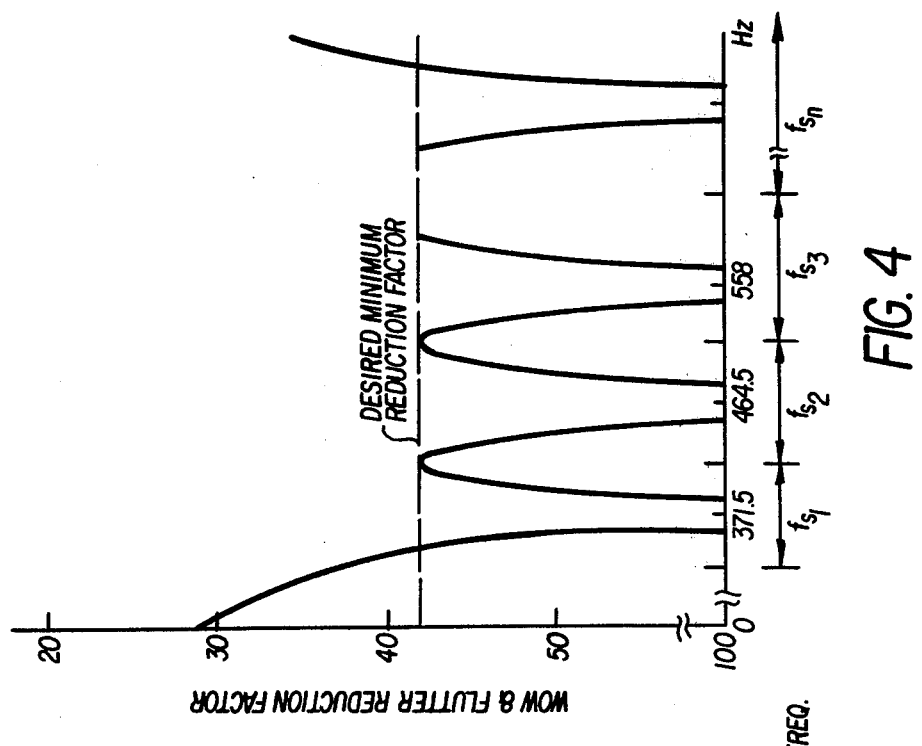
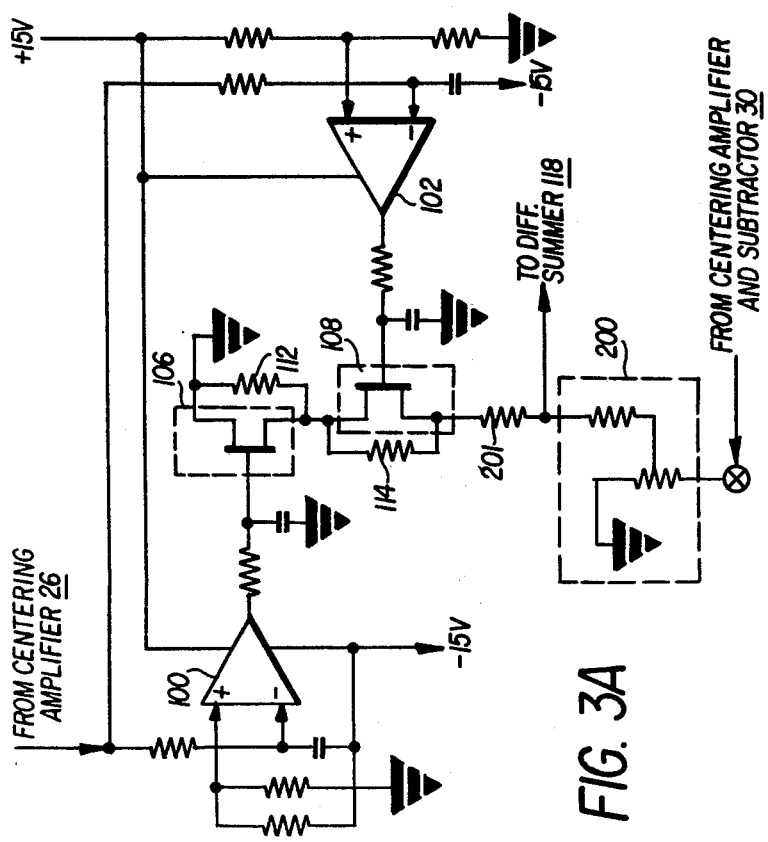
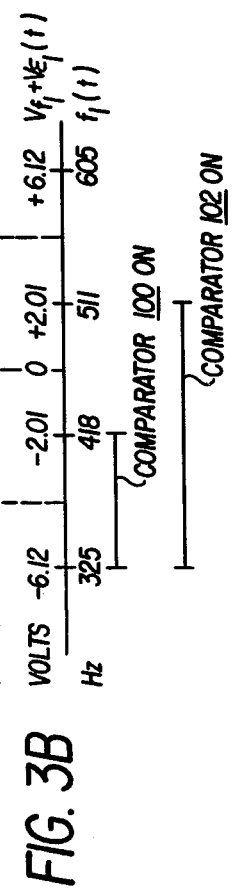
FIG. 3A
FIG. 3B
FIG. 4

MULTI-STATE WOW AND FLUTTER REDUCTION SYSTEM AND METHOD

BACKGROUND OF THE INVENTION

The present invention relates generally to the reproduction of recorded signals. More particularly, the present invention relates to a method of and system for compensating a recorded signal for deviations in frequency caused by wow and flutter during recording and reproduction of the signal.

In the recording and reproduction of signals by passing a recording medium past a transducer, such as magnetic head, the density of the recorded signal depends upon the speed of the recording medium, as well as the frequency of the input signal. On reproduction, by passing the recording medium over the transducer, the frequency of the output signal is thus determined by the speed of the recording medium relative to the transducer, as well as the original information signal frequencies. Information recorded and reproduced in this manner usually experiences frequency deviations from the original signal which are more or less tolerable depending upon the intended use of the reproduced signal.

Various causes of these deviations can produce either a constant difference in frequency between the recorded and reproduced signal, a continually changing difference between these frequencies, or, a more or less periodic cyclic variation in the differences between these frequencies. Any substantial constant difference between recorded and reproduced frequencies can usually be eliminated by adjusting the recording speed to the reproducing speed, as for example, by utilizing a synchronous motor or the like. However, this approach involves a substantial expenditure for such a motor and control system therefor.

Continual unidirectional changes in frequency are not usually encountered, except as transients during acceleration and deceleration of the recording medium relative to the transducers. Cyclic changes in frequency are conventionally divided into two more or less overlapping categories. Deviations in the range from 0 to 1 Hertz, for example, are commonly termed "wow," whereas deviations between 1 and 100 Hertz or more are termed "flutter." The effects of wow and flutter on the reproduced sound, for example, of recorded music are not so drastic that moderate amounts cannot be tolerated, although precision turntables are employed where high fidelity is a requirement.

On the other hand, wow and flutter are especially serious in the reproduction of carrier signals which are frequency modulated at low information signal frequencies. Such signals would normally be preferred over amplitude modulated carriers for many purposes, such as to record and reproduce transducer signals which repeat conditions that change relatively slowly, e.g., the output of a cardiac monitor, a temperature recorder, a position transducer. In such a system, the information to be transferred is imposed on a basic frequency signal (carrier) by decreasing or increasing the carrier frequency in accordance with the information intelligence. Amplitude information is determined by carrier frequency change and frequency information is determined by the rate at which the carrier frequency changes. The percentage of carrier frequency change is typically 10 percent or less of the basic carrier frequency. These low frequencies are, therefore, typically in the frequency range affected by wow and flutter and it is not generally practical to record and reproduce such signals because of the difficulty of making an economical recorder in which wow and flutter are so reduced as to avoid interference with the recorded information.

The reduction of wow and flutter is especially important in apparatus used to electronically reproduce signatures, such as the signature reproducer described in U.S. Pat. No. 3,733,612. In that system, handwriting coordinates are divided into two channels which record the two-dimensional movement of a pen or stylus in terms of frequency. The carrier frequency disclosed in this apparatus is 1,400 Hz and the coordinate information superposed on the carrier causes the carrier to vary ±90 Hz. Therefore, the position information of the pen or stylus is in a bandwidth of 180 Hz. It will be apparent, therefore, that even minor variations in motor speed can result in serious distortion of the frequency information and ultimately the signature to be reproduced. Although a number of prior art devices attempt to overcome the aforementioned variations in tape speed by accurately controlling the capstan and tape speeds, such types of speed control devices are delicate and expensive, which generally makes them undesirable for use in many recording devices and environments.

In apparatus for recording and reproducing handwriting, accurate intelligence transmission is particularly critical. In addition, such equipment is most often used in an office environment where the operator is oftentimes neither especially skilled nor fully aware of the limitations of the equipment. Therefore, the use of delicate speed control devices for reducing wow and flutter in signature reproducers is undesirable.

Various other wow and flutter compensation schemes have been proposed in which a reference signal is recorded with the information signal. Circuits employing variable delay lines have been suggested to eliminate the effects of wow and flutter in an information signal by comparison with the error found between a simultaneously recorded pilot signal and a reference signal. In theory, such apparatus may be capable of making the desired correction. In practice, however, the variable delay line would be difficult to adjust and maintain in adjustment so that it would be particularly difficult to establish useful standards of performance which could be maintained from unit-to-unit and from day-to-day in a given unit.

One approach to solving the problem of wow and flutter in recording devices is suggested in U.S. Pat. No. 3,803,630 (related to earlier U.S. Pat. No. 3,582,956). The apparatus of the -630 patent transmits positional intelligence via frequency modes, which, if compared with a reference signal, produces an error correction signal during reproduction to account for tape speed variations between recording and playback. An analog divider circuit is utilized which is theoretically capable of perfect compensation. However, the assumption is made in the patent that the wow and flutter component in all the channels is equal, an assumption which does not permit the proper cancelling of the recording and playback errors since wow and flutter varies with the frequency deviation of an FM signal about its carrier frequency.

Another approach used to reduce wow and flutter in a recording system is disclosed in U.S. Pat. No. 3,872,504 which employs the concept of simultaneously recording a reference channel and linearly subtracting the wow and flutter from the desired channel via a mixing scheme. This approach has not been found to be a totally satisfactory solution since the amount of cancellation of the wow and flutter depends upon the exact frequency being processed. That is, the wow and flutter reduction factor decreases rapidly as the frequency deviates from the center carrier frequency, or that frequency where the compensation is theoretically perfect.

Another approach for reducing wow and flutter is disclosed in U.S. Pat. No. 3,839,729 wherein a pilot frequency is recorded with the information signal. Upon reproduction, the information signal is modulated with a signal derived from the pilot frequency to produce a sideband in which frequency deviation components introduced in recording and reproduction are absent. However, this approach is complex and costly to implement.

SUMMARY AND OBJECTS OF THE INVENTION

In view of the foregoing, it should be apparent that there still exists a need in the art for a method and apparatus for compensating recorded and reproduced signals for frequency deviations caused by wow and flutter in which electronic means are utilized in a simple and precise manner to accomplish a substantial reduction of wow and flutter over a broad frequency band. It is, therefore, a primary object of this invention to provide a method and apparatus for reducing wow and flutter over a broad frequency band which is characterized by simple electronic circuitry and which has particular application for an electronic handwriting recording and reproducing apparatus.

More particularly, it is an object of this invention to provide frequency compensation apparatus as aforementioned having simple and reliable electronic circuitry which does not require frequent alignment nor costly components.

Still more particularly, it is an object of this invention to provide frequency compensation means utilizing a simple linear cancellation scheme which provides cancellation over a wide band of frequencies by automatically adjusting the cancellation effect in a digital manner.

Another object of the present invention is to provide reliable and relatively inexpensive frequency compensation circuitry for use in reducing wow and flutter in electronic handwriting systems.

A further object of the present invention is to provide a method of reducing wow and flutter in recorded and reproduced signals wherein the reproduced signal is converted to a voltage responsive to the recorded frequency, centered about another voltage, transmitted to a multi-state control circuit, and finally reconverted into a frequency modulated signal to obtain the recorded signal substantially free of detrimental wow and flutter components.

Briefly described, these and other objects of the invention are accomplished in accordance with its apparatus aspects by providing a series of comparators whose outputs are connected to switches which in turn are connected across resistors. An incoming signal from a centering amplifier is compared with a different reference voltage by each comparator. If the voltage is within the proper range, the comparator causes the switch to close which removes its associated resistor from a voltage divider network to which an error voltage has been applied. The operation of the comparators may be arranged in such a manner to provide sequential steps of attenuation of the error voltage, according to the frequency of the reproduced signal, in order to more fully cancel the error effects associated with the reproduced signal because of wow and flutter.

The method of the present invention is carried out by recording at least one channel of information and one reference channel. These reproduced signals are fed to respective frequency to voltage converters which provide voltage outputs according to variations in the frequency applied. Since both the recorded signal and a wow and flutter error signal are reproduced, the output of each frequency converter is a voltage which represents both the signal and its associated error. This combined voltage is centered in each instance, and, in the case of the reference voltage, a voltage representing only the reference signal is subtracted therefrom. The combined voltage and the error signal are both transmitted to a frequency responsive, multi-state control circuit in which the error voltage is matched in strength, according to the frequency of the reproduced signal, to the error component of the combined voltage so that the two error terms cancel one another. The resulting voltage represents the recorded signal and is reconverted from its frequency responsive voltage form to the original frequency modulated information signal substantially free of the wow and flutter components.

With these and other objects, advantages and features of the invention that may become hereinafter apparent, the nature of the invention may be more clearly understood by reference to the following detailed description of the invention, the appended claims and to the several drawings attached herein.

BRIEF DESCRIPTION OF THE DRAWINGS

FIG. 3a is a schematic diagram showing implementation of one embodiment of a major portion of the multistate control circuit;

FIG. 3b is a diagram illustrating the operation of one embodiment of the multi-state control circuit; and FIG. 4 is a graph illustrating the wow reduction factor versus frequency for an embodiment of the present invention.

DETAILED DESCRIPTION OF THE PREFERRED EMBODIMENT

Figure 1:
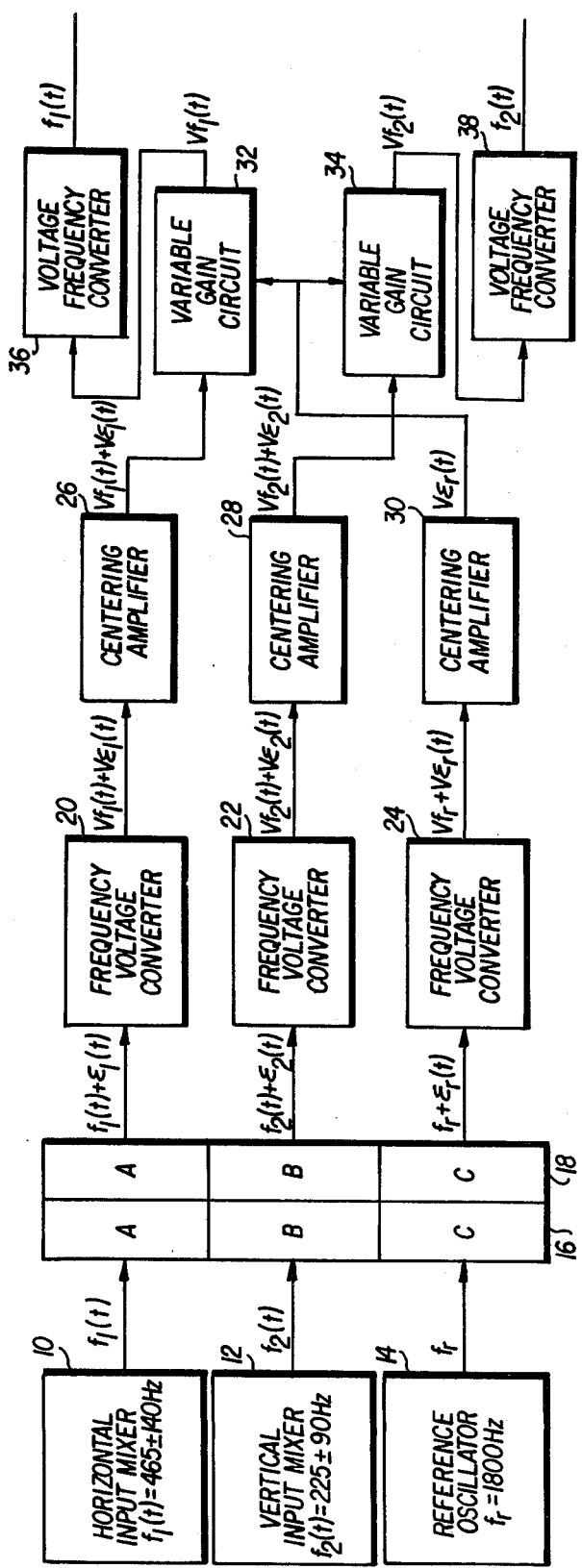
FIG. 1 is a block diagram showing the apparatus of the present invention.

Referring now in detail to the drawings wherein like parts are designated by like reference numerals throughout, there is illustrated in FIG. 1 a three channel tape recorder 16 to which the output of a horizontal input mixer 10, a vertical input mixer 12, and a reference oscillator 14 are applied. It should be understood, however, that the present invention may comprise a plurality of channels in addition to those mentioned above. The input signals recorded by the recorder 16 are played back by a playback tape recorder 18 and each signal is transmitted to a respective frequency to voltage converter, 20, 22, and 24. Each frequency to voltage converter of the information channels is in turn connected to a respective centering amplifier 26 and 28, while the reference channel frequency to voltage converter is connected to a centering amplifier and subtractor 30. The output of centering amplifier 26 of the horizontal channel is connected to a multi-state or variable gain control circuit 32. Likewise, the output of the centering amplifier 28 of the vertical channel is connected to a multi-state or variable gain control circuit 34. Each such multistate control circuit 32, 34 is in turn connected to voltage to frequency converters 36 and 38 respectively. The output of the reference channel centering amplifier and subtractor 30 is connected to each multi-state control circuit, 32 and 34. The outputs of the voltage to frequency converters are equivalent to the original input signals.

In operation, an FM carrier signal with the output from a transducer, such as a stylus or pen, imposed thereon comprises the output of horizontal input mixer 10. Such signal may typically be 465 ±140 Hz, where the ± 140 Hz represents the actual information transmitted by the transducer. Since the operation of all such information channels is the same except that different carrier frequencies and deviations are utilized, only the operation of one information channel will be described. Simultaneously with the transmission of the signal from input mixer 10 to the recorder 16, the reference signal, typically a 1800 Hz signal, is also transmitted to the recorder. Thus, two signals, the input signal, $f_1(t)$, and the reference signal, $f_r$, are recorded upon a suitable recording medium. Playback tape recorder 18 produces outputs from the recording medium, however, these signals now comprise the original signal and an additional error component as a result of the wow and flutter of the tape recorder. This can best be represented by $f_1(t) + \epsilon_1(t)$ and $f_r + \epsilon_r(t)$ for the information signal and the reference signal, respectively. Since the error signals $\epsilon_1(t)$ and $\epsilon_r(t)$ were produced by wow and flutter occurring at the same instant, it would at first appear that the two error terms should be equivalent. However, it has been found that they are not because they are frequency dependent.

As mentioned above, when two signals $f_1(t)$ and $f_r(t)$ are recorded and then played back through recorder 18, the resulting signals from the playback recorder have picked up an error term, $\epsilon_1(t)$ and $\epsilon_r(t)$, respectively. The first signal is represented by $f_1(t) + \epsilon_1(t)$ and the second by $f_r + \epsilon_r(t)$. If these two signals are subtracted from each other after the reference error signal is amplified or adjusted by some factor G, the resultant signal $e_{out}$ would be equal to the input information signal $f_1(t)$.

Note that the actual amount of frequency error $\epsilon_1(t)$ or $\epsilon_r(t)$ depends on the frequencies $f_1(t)$ and $f_r(t)$ respectively, since the associated wow and flutter induces the same percentage error in each signal. If, for example, $f_1(t)$ is twice $f_r(t)$, then $\epsilon_1(t)$ will be twice $\epsilon_r(t)$. This is the reason the adjustment factor G must be used to make the two error values equal.

Note also that if $f_1(t)$ slowly varies by a significant amount, compensation will degrade since the actual amount of frequency error $\epsilon_1(t)$ will vary proportionally to $f_1(t)$. This is the basis of the multi-state reduction system, i.e., G is discretely adjusted to maintain perfect compensation at selected frequencies over the operating range of $f_1(t)$. Continuing, the reference signal frequency is first subtracted from the combined reference signal and its error, $f_r + \epsilon_r(t)$, and the remaining signal, $\epsilon_r(t)$ is multiplied (amplified) by an amplification factor G. In order to obtain perfect cancellation of the error signal $\epsilon_r(t)$ with $\epsilon_1(t)$, the adjusting factor G must equal the frequency about which the information signal varies divided by the reference frequency. The frequency G must equal is more commonly known as the carrier or center frequency plus or minus the frequency deviation or bandwidth of the information signal. This relationship is represented by $G = [f_{1_o} - \Delta f_1(t)]/f_r$; $(f_{1_o}/f_r)$; and $[f_{1_o} + \Delta f_1(t)]/f_r$ Thus, for each value of G, the result desired, namely that $e_{out} = f_1(t)$ is obtained. Since $\epsilon_1(t)$ varies proportionally to $f_1(t)$, perfect cancellation can occur at only one frequency for any value of G. By the division of the information bandwidth into three segments, each with its own value of G, the desired minimum reduction factor can be obtained over the entire information bandwidth. Multiplying the reference error times the amplification factor G (the most easily understood case where $G = f_{1_o}/f_r$ is used for illustrative purposes only) results in a signal comprising the product of the carrier signal times the reference signal error divided by the reference frequency or $[\epsilon_r(t)] [f_{1_o}]/f_r$.

This represents the reference error signal as it is applied to a subtractor to which the information signal and its associated error are also applied to cancel the error components and obtain the recorded information signal. This resulting signal, $e_{out}$, is thus equal to the information signal plus its associated error minus the product of the reference error times the carrier frequency divided by the reference frequency. This can best be expressed by the equation:

$e_{out} = f_1(t) + \epsilon_1(t) - [\epsilon_r(t) f_{1_o}]/f_r$

It should be noted at this point that both the carrier signal and the reference signal are constant, and are not time dependent, and thus are expressed without the $(t)$ indicative of such dependency. Since $\epsilon_r(t)$ is related to $f_r$ as $\epsilon_1(t)$ is related to $f_1(t)$, the relationship can be expressed as an equation. Thus, the error of the information signal divided by the information signal is equal to the error of the reference signal divided by the reference signal, or, $\epsilon_1(t)/f_1(t) = \epsilon_r(t)/f_r$. It is desired to cancel the error signal in the information signal, so that the information error will be equal to the reference error at the time it is applied to the subtractor. Thus, since it is known that the reference error at the subtractor is equal to the product of the reference error signal times the amplification factor, it can be seen that the information error must equal the amplification factor times the reference error to obtain the requisite cancellation. Dividing both sides of the equation by the reference error yields the equation: $G = \epsilon_1(t)/\epsilon_r(t)$, which is already known to be equal to the carrier signal divided by the reference signal. This term $(f_{1_o}/f_r)$ can be substituted for the amplification factor G to yield $\epsilon_1(t) = \epsilon_r(t) (f_{1_o}/f_r)$. By substituting this expression of the information error term in the equation of the desired output of the subtractor, that output term results in the original information signal $f_1(t)$ without the wow and flutter term $\epsilon_1(t)$. However, this only perfectly cancels the error in the information signal at the center frequency of 465 Hz, therefore, the other equivalent terms of the amplification factor are used at other frequencies of the information input signal to obtain substantial cancellation at all frequencies utilized by the present invention.

Each signal from the playback tape recorder 18 is fed to a different frequency to voltage converter to obtain a direct current voltage which is proportional to the frequency of the signal. Thus, the information signal and its associated error, $f_1(t) + \epsilon_1(t)$ is converted to a voltage, $Vf_1(t) + V\epsilon_1(t)$ transmitted from frequency converter 20 and the reference signal and its associated error, $f_r + \epsilon_r(t)$ is converted to a proportional voltage, $Vf_r + V\epsilon_r(t)$ transmitted from frequency converter 24. The output of frequency converter 20 is fed to a centering amplifier 26 which provides an output voltage corresponding to its input that typically varies between approximately +6V and −6V. The output of frequency converter 24 is fed to a centering amplifier and subtractor 30, whose output is centered between the same voltage values. However, the reference signal is added to this component with the result that the output of this centering amplifier and subtractor comprises only the reference frequency converted to a voltage by converter 24.

At this point, the voltages in each channel of the invention are as follows: the voltage in the horizontal channel represents the information signal plus its associated error while the voltage in the reference channel represents only the reference error signal. These two voltages are applied to a multi-state control circuit 32 which provides appropriate amplification of the reference error voltage relative to the information voltage and its associated error voltage. This compensation is frequency determinant as will be explained hereinafter. The multi-state control circuit also subtracts the reference error voltage from the information voltage and its associated error voltage to obtain an output voltage which is proportional to the information frequency. The output of the multi-state control circuit is transmitted to a voltage to frequency converter 36, whose output is a frequency proportional to its input voltage, or the recorded information signal. A multi-state control circuit and a voltage to frequency converter is required for each information channel utilized.

Figure 2:
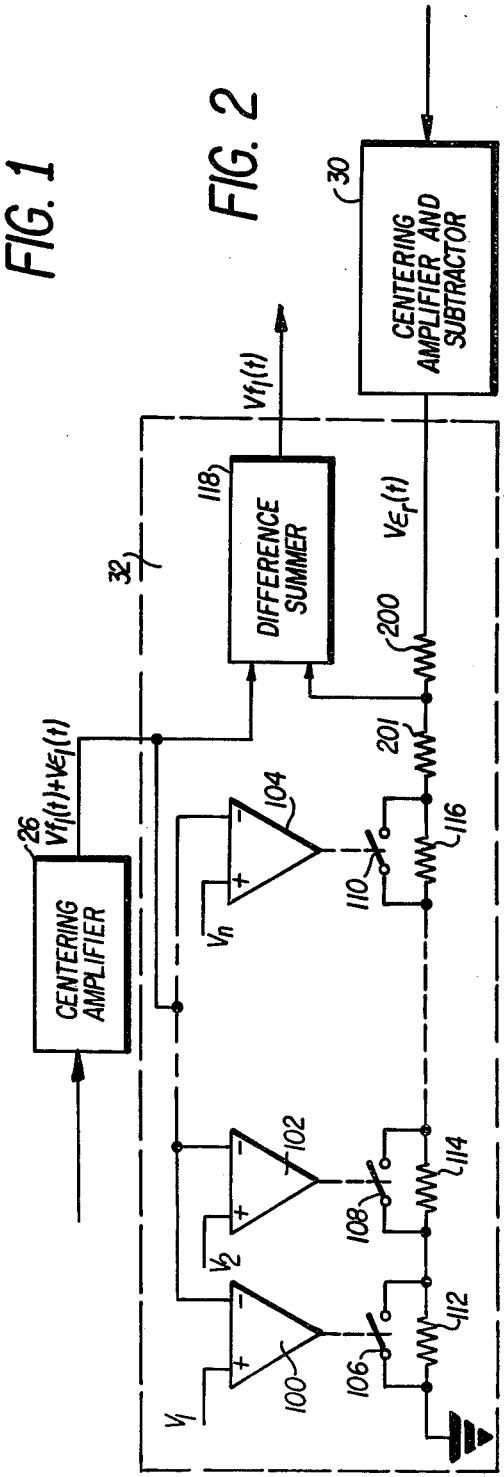
FIG. 2 is a schematic block diagram of the multistate control circuit of the invention.

FIG. 2 schematically illustrates a multi-state control circuit 32 in which a plurality of comparators 100 through 104 equal to the number of information channels utilized are uniquely connected to a like number of electronic switches 106 through 110, each of which is connected in shunt across resistors 112 through 116. All such gain control circuits utilized in the present invention comprise the same components connected in the same manner, but with different component values and comparison voltages. Therefore, only the multi-state control circuit 32, utilized in the horizontal channel in the embodiment of the invention in FIG. 1 will be described.

The centering amplifier 26 is connected to each negative (−) input of each comparator as well as to a difference summer 118. The positive (+) input of each comparator is connected to a different comparison voltage $V_1$ through $V_n$ while the centering amplifier and subtractor 30 is connected through a dividing resistor 200 to the difference summer 118 and through a resistor 201 to a plurality of resistors 112 through 116, which resistors are connected in series through each other to ground. The output of the difference summer 118 is a voltage proportional to the frequency of the information input signal.

Multi-state control circuit 32 operates as a multi-state, frequency-dependent voltage dividing network, and while using simple linear cancellation, provides such cancellation over a wide band of frequencies by automatically adjusting the cancellation effect in a digital manner. In such a circuit where only two comparators are needed to provide a three-segment frequency band, a different comparison voltage, $V_1$ or $V_2$, is applied to the positive input of each comparator. Such voltages are predetermined according to the total frequency band to be segmented, the number of segments desired, and the range of possible values of the information frequency-converted-to-voltage input signal. The output from the centering amplifier 26 is applied to both negative inputs of the comparator. When this frequency sensitive voltage equals or exceeds the predetermined levels of either or both of the applicable comparison voltages $V_1$ and $V_2$, the respective comparator generates an output which closes its respective electronic switch. This, in turn, removes either resistor 112 or resistor 114 or both from a series configuration with resistor 201 and dividing resistor 200, to which series combination is applied $V\epsilon_r(t)$, the voltage signal representing the error component of the reference signal and transmitted by centering amplifier and subtractor 30. The input to difference summer 118 is connected to the dividing resistor 200 between such dividing resistor 200 and resistor 201. Thus, a voltage divider is formed by resistors 112, 114, 201, and 200, while resistors 112 and 114 are connected into the circuit. The reference voltage points are chosen so that either resistor 112, both resistors 112 and 114, or neither resistor remain in the dividing network. It can, therefore, be easily seen that three different output voltages of $V\epsilon_r(t)$ are possible, depending upon which resistors if any, remain in series with dividing resistor 200. If neither resistor 112 or 114 are disconnected from the circuit by $Vf_1(t) + V\epsilon_1(t)$, the output from centering amplifier 26, the voltage corresponding to the error in the reference input will be determined by the dividing network composed of all the resistors, and the reference error voltage will be proportional to the sum of resistors 112, 114, and 201 divided by the sum of all four resistors. If resistor 114 is removed from the series combination by comparator 102 in response to $Vf_1(t) + V\epsilon_1(t)$, then the reference error voltage will be proportional to the resistance of resistors 112 and 201 divided by the resistance of resistor 200. If neither resistor 112 nor resistor 114 remains in a series combination with dividing resistor 200, the voltage transmitted to the difference summer 118 will be proportional to the resistance of resistor 201 divided by the dividing resistor 200.

The voltage representing the information input signal and its associated error is also applied to the difference summer 118. The difference summer subtracts $V\epsilon_r(t)$ from $VF_1(t) + V\epsilon_1(t)$ and obtains $Vf_1(t)$ as a result since the reference error voltage has been compensated according to the frequency on the information signal. This frequency-dependent voltage representing the information signal is then transmitted to a voltage to frequency converter 36 to obtain the recorded information signal 10.

Those skilled in the art to which this circuit pertains will readily recognize numerous methods of obtaining a frequency dependent, multi-state, voltage dividing network based upon the present information, such as using normally closed switches and connecting the resistors into the series circuit with resistor 201 and the dividing resistor.

By way of example, and not as a limitation, FIG. 3a illustrates one embodiment of a multi-state control circuit which comprises a portion of the invention herein. This figure is disclosed in order to provide an example of the implementation of the multi-state control circuit in actual hardware. FIG. 3b illustrates the frequencies used in implementing the multi-state resistor, voltage divider network of FIG. 3a.

Now referring to FIGS. 3a and 3b, neither comparator 100 nor 102 is turned on until $Vf_1(t) + V\epsilon_1(t)$ falls to or below +2.01 volts. Therefore, until that time, both resistors 112 and 114 are connected in series to each other and to resistor 201 and dividing resistor 200, and the frequency compensated reference error voltage is proportional to the sum of resistors 112, 114, and 201 divided by the sum of resistors 112, 114, 201 and 200. This provides perfect error compensation at 558 Hz when the information signal $f_1(t)$ is 465 Hz ± 140 Hz, and is equidistant between the 511 Hz and 605 Hz frequency points which correspond to the +2.01 volts comparator 102 turn on point and the input signal of +6.12 volts limit from centering amplifier 26 to the comparators.

Whenever $Vf_1(t) + V\epsilon_1(t)$ is equal to +2.01 volts and does not fall to −2.01 volts, comparator 102 is enabled, or turns on, and closes electronic switch 106, which in this embodiment may be a 2N3819 transistor. However, any suitable electronic switch may be utilized instead. Closing the switch is equivalent to removing resistor 114 from the series combination. Thus, the frequency compensated reference error voltage is now proportional to the sum of resistors 112 and 201 divided by the sum of resistors 112, 201, and 200. This provides perfect error compensation at 464.5 Hz, which is again midway between the applicable switch points of −2.01 volts and +2.01 volts or 418 Hz and 511 Hz for the information input frequencies indicated above.

Finally, when $Vf_1(t) + V\epsilon_1(t)$ is equal to or less than −2.01 volts and greater than or equal to −6.12 volts (the practical minimum voltage), both comparator 102 and comparator 100 will be turned on, closing their associated switches 108 and 106. This effectively leaves only resistor 201 in series with dividing resistor 202 and the frequency compensated reference error voltage will be proportional to resistor 201 divided by the sum of resistors 201 and 200. This corresponds to a perfect error compensation frequency point of 371.5 Hz, with the above indicated information input frequency.

FIG. 4 is a graph illustrating the multi-state operation of the gain control circuit for n frequency segments ($f_{s_n}$), and more particularly, for the frequency information illustrated in FIG. 3b. The perfect compensation frequencies for the specific example illustrated in FIG. 3b occur below the desired minimum value of reduction of the wow and flutter created error by the frequency compensated reference error signal. The three frequency segments specifically used in FIG. 3b are also indicated in FIG. 4. Now referring to FIG. 4, it will be seen that by dividing the frequency band of the information input signal into multi-state, frequency-actuated frequency segments, the error due to wow and flutter has been reduced substantially, at most frequencies to a negligible amount. It can also be seen that the method and means of the present invention may be utilized to provide n number of frequency segments delineated by n number of frequency responsive switching means controlling n number of resistors comprising a series combination of resistors each, in turn, series connected to form a suitable voltage dividing network. Further, any number of such multi-state control circuits may be utilized in the present invention for any corresponding number of information channels.

In view of the foregoing, it should be apparent that there is provided by the present invention a circuit for compensating a playback signal from a tape recorder for frequency deviations resulting from the wow and flutter inherent in such tape recording and playback devices. The invention includes a multi-state control circuit responsive to the information input frequency for compensating the reference error voltage before it is linearly subtracted from the sum of the voltages representing the information input and its associated error, such error being the result of the wow and flutter of the tape recorder. Thus, the method and means of the present invention reduces the effects of the wow and flutter to negligible levels over the entire frequency bandwidth of the information input signal.

Although only a preferred embodiment is specifically illustrated and described herein, it will be appreciated that many modifications and variations of the present invention are possible in light of the above teachings and within the purview of the appended claims without departing from the spirit and intended scope of the invention.

What is claimed is:

1. A recording and reproducing system for recording vertical and horizontal positional information and for reproducing said positional information comprising;

recording and reproducing means including channel means A, B and C for simultaneously recording vertical and horizontal positional information signals $f_1(t)$ and $f_2(t)$ and a reference signal $f_r$ in a respective channel means A, B and C, means for reproducing said information signals and reference signal to produce output signals $f_1(t) + \epsilon_1(t)$, $f_2(t) + \epsilon_2(t)$ and $f_r + \epsilon_r(t)$ having wow and flutter frequency errors $\epsilon_1(t)$, $\epsilon_2(t)$ and $\epsilon_r(t)$, respectively, introduced into said information and reference signals by said recording and reproducing means;

frequency to voltage converter means connected to said channel means for converting said output signals into frequency dependent voltages $Vf_1(t) + V\epsilon_1(t)$, $Vf_2(t) + V\epsilon_2(t)$ and $Vf_r + V\epsilon_r(t)$, in a respective one of said channel means A, B and C;

variable gain means connected to said frequency to voltage converter means for varying the gain of said frequency dependent voltage $V\epsilon_r(t)$ in a plurality of discrete voltage steps and for providing signals substantially equivalent to the error voltages $V\epsilon_1(t)$ and $V\epsilon_2(t)$, and for removing said error voltages $V\epsilon_1(t)$ and $V\epsilon_2(t)$ from said frequency dependent voltages $Vf_1(t) + V\epsilon_1(t)$ and $Vf_2(t) + V\epsilon_2(t)$, respectively, to provide frequency dependent voltages $Vf_1(t)$ and $Vf_2(t)$; and voltage to frequency converter means connected to said variable gain means for converting said frequency dependent voltages $Vf_1(t)$ and $Vf_2(t)$ into output signals substantially equivalent to said positional information signals $f_1(t)$ and $f_2(t)$.

2. A system according to claim 1, including means connected between the frequency to voltage converter means and said variable gain means for centering said frequency dependent voltages $Vf_1(t) + V\epsilon_1(t)$, $Vf_2(t) + V\epsilon_2(t)$ and $Vf_r + V\epsilon_r(t)$ about a predetermined voltage and for subtracting the frequency dependent voltage $Vf_r$ from the frequency dependent voltage $Vf_2 + V\epsilon_r(t)$.

3. A system according to claim 1, wherein said recording and reproducing system comprises a signature reproducer.

4. A recording and reproducing system for recording vertical and horizontal positional information and for reproducing said positional information comprising:

recording and reproducing means including channel means A, B and C for simultaneously recording vertical and horizontal positional information signals $f_1(t)$ and $f_2(t)$ and a reference signal $f_r$ in a respective channel means A, B and C, means for reproducing said information signals and reference signal to produce output signals $f_1(t) + \epsilon_1(t)$, $f_2(t) + \epsilon_2(t)$ and $f_r + \epsilon_r(t)$ having wow and flutter frequency errors $\epsilon_1(t)$, $\epsilon_2(t)$ and $\epsilon_r(t)$, respectively, introduced into said information and reference signals by said recording and reproducing means;

frequency to voltage converter means connected to said channel means for converting said output signals into frequency dependent voltages $Vf_1(t) + V\epsilon_1(t)$, $Vf_2(t) + V\epsilon_2(t)$ and $Vf_r + Ver(t)$, in a respective one of said channel means A, B and C;

variable gain means connected to said frequency to voltage converter means for varying the gain of said frequency dependent voltage $V\epsilon_r(t)$ and for providing signals substantially equivalent to the error voltages $V\epsilon_1(t)$ and $V\epsilon_2(t)$, and for removing said error voltages $V\epsilon_1(t)$ and $V\epsilon_2(t)$ from said frequency dependent voltages $Vf_1(t) + V\epsilon_1(t)$ and $Vf_2(t) + V\epsilon_2(t)$, respectively, to provide frequency dependent voltages $Vf_1(t)$ and $Vf_2(t)$, said means for varying the gain of said frequency dependent voltage $V\epsilon_r(t)$ including comparing means for comparing said frequency dependent voltages $Vf_1(t) + V\epsilon_1(t)$ and $Vf_2(t) + V\epsilon_2(t)$ with a predetermined voltage and for providing an output when said frequency dependent voltages $Vf_1(t) + V\epsilon_1(t)$ and $Vf_2(t) + V\epsilon_2(t)$ have a predetermined voltage, said comparing means being connected to means responsive to the output of said comparing means for varying the magnitude of the gain of said frequency dependent voltage $v\epsilon_r(t)$ to provide output voltages $G_1V\epsilon_r(t)$ and $G_2V\epsilon_r(t)$ substantially equivalent to $V\epsilon_1(t)$ and $V\epsilon_2(t)$ respectively; and voltage to frequency converter means connected to said variable gain means for converting said frequency dependent voltages $Vf_1(t)$ and $Vf_2(t)$ into output signals substantially equivalent to said positional information signals $f_1(t)$ and $f_2(t)$.

5. A system according to claim 4, wherein said variable gain means further includes means for subtracting said output voltages $G_1V\epsilon_r(t)$ and $G_2V\epsilon_r(t)$ from said frequency dependent voltages $Vf_1(f) + V\epsilon_1(t)$ and $Vf_2(t) + V\epsilon_2(t)$ to provide output voltages $Vf_1(t)$ and $Vf_2(t)$ respectively.

6. A system according to claim 4, wherein said means providing said output voltages $G_1V\epsilon_r(t)$ and $G_2V\epsilon_r(t)$ comprise voltage dividers and switching means for varying the resistance of said voltage dividers.

7. A method of recording and reproducing vertical and horizontal positional information comprising the steps of:

recording vertical and horizontal positional information signals $f_1(t)$ and $f_2(t)$ and a reference signal $f_r$;

reproducing said information and reference signals to produce output signals $f_1(t) + \epsilon_1(t)$, $f_2(t) + \epsilon_2(t)$ and $f_r + \epsilon_r(t)$ having wow and flutter frequency errors $\epsilon_1(t)$, $\epsilon_2(t)$ and $\epsilon_r(t)$, respectively, introduced into said information and reference signals by said recording and reproducing steps;

converting said output signals into frequency dependent voltages $Vf_1(t) + V\epsilon_1(t)$, $Vf_2(t) + V\epsilon_2(t)$ and $Vf_r + V\epsilon_r(t)$ having error voltage terms $V\epsilon_1(t)$, $V\epsilon_2(t)$ and $V\epsilon_r(t)$; varying the gain of said frequency error voltage term $V\epsilon_r(t)$ in a plurality of discrete voltage steps to provide output signals $G_2V\epsilon_r(t)$ and $G_2V\epsilon_r(t)$ substantially equivalent to the error voltage terms $V\epsilon_1(t)$ and $V\epsilon_2(t)$; respectively;

subtracting the error voltage terms $G_1V\epsilon_r(t)$ and $G_2V\epsilon_r(t)$ from said frequency dependent voltages $Vf_1(t) + V\epsilon_1(t)$ and $Vf_2(t) + V\epsilon_2(t)$ respectively to provide frequency dependent voltages $Vf_1(t)$ and $Vf_2(t)$; and converting said frequency dependent voltages $Vf_1(t)$ and $Vf_2(t)$ into output signals substantially equivalent to said positional information signals $f_1(t)$ and $f_2(t)$.

8. A recording and reproducing system comprising means for recording a first information signal $f_1(t)$ and a reference signal $f_r$, means for reproducing said information signal $f_1(t) + \epsilon_1(t)$ and a reproduced reference signal $f_r + \epsilon_r(t)$, said reproduced signals including wow and flutter frequency error terms $\epsilon_1(t)$ and $\epsilon_r(t)$, respectively, introduced by reason of the mechanical inaccuracies of the system and means for reducing the wow and flutter frequency error term $\epsilon_1(t)$ in said reproduced information signal, wow and flutter reduction means comprising means for amplifying at least the error component $\epsilon_r(t)$ in the reproduced reference signal $f_r + \epsilon_r(t)$ by a gain G to generate an output signal including the term $G\epsilon_r(t)$, means for subtracting the output term $G\epsilon_r(t)$ from the reproduced information signal to generate an output signal including the terms $f_1(t) + \epsilon_1(t) - G\epsilon_r(t)$ and means for varying the gain G of the amplifying means in a plurality of discrete voltage steps in accordance with the value $f_1(t)/f_r = \epsilon_1(t)/\epsilon_r(t)$ to substantially remove or reduce the error term $\epsilon_1(t)$ from the output signal of the subtracting means.

9. In a recording and reproducing system including an information signal $f_1(t)$ and a reference signal $f_r$ wherein the mechanical inaccuracy of the system introduces a proportional error component into both a reproduced information signal $f_1(t) + \epsilon_1(t)$ and a reproduced reference signal $f_r + \epsilon_r(t)$, the error reduction method comprising the steps of amplifying at least the error $\epsilon_r(t)$ in the reproduced reference signal $f_r + \epsilon_r(t)$ by a gain G to generate an output including the term $G\epsilon_r(t)$, subtracting the output $G\epsilon_r(t)$ of the amplifying step from the reproduced information signal to obtain an output signal including the terms $f_1(t) + \epsilon_1(t) - G\epsilon_r(t)$, and varying the gain G of the amplifying step in a plurality of discrete voltage steps in accordance with the value of $f_1(t)/f_r = \epsilon_1(t)/\epsilon_r(t)$ to substantially reduce or remove the error term $\epsilon_1(t)$ from the output of the subtracting step.

* * * * *